US007235155B2

(12) United States Patent
Fink

(10) Patent No.: US 7,235,155 B2
(45) Date of Patent: Jun. 26, 2007

(54) METHOD AND APPARATUS FOR MONITORING PLASMA CONDITIONS USING A MONITORING RING

(75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 324 days.

(21) Appl. No.: 10/788,328

(22) Filed: Mar. 1, 2004

(65) Prior Publication Data

US 2004/0177922 A1   Sep. 16, 2004

Related U.S. Application Data

(60) Provisional application No. 60/454,359, filed on Mar. 14, 2003.

(51) Int. Cl.
*H01L 21/00* (2006.01)
*C23C 16/00* (2006.01)
(52) U.S. Cl. ............ 156/345.24; 156/345.34; 156/345.25; 156/345.26; 156/345.27; 118/712; 204/192.1; 204/298.01
(58) Field of Classification Search ........... 156/345.24, 156/345.25, 345.26, 345.27, 345.34; 118/712; 204/192.1, 298.01
See application file for complete search history.

(56) References Cited

U.S. PATENT DOCUMENTS

| 2001/0015175 A1* | 8/2001 | Masuda et al. ......... 118/723 R |
| 2001/0047760 A1* | 12/2001 | Moslehi .................. 118/723 I |
| 2003/0164226 A1* | 9/2003 | Kanno et al. ......... 156/345.51 |

FOREIGN PATENT DOCUMENTS

| JP | 06204143 A * | 7/1994 |
| JP | 2001093882 A * | 4/2001 |

* cited by examiner

*Primary Examiner*—Ram N. Kackar
(74) *Attorney, Agent, or Firm*—Oblon, Spivak, McClelland, Maier & Neustadt, P.C.

(57) ABSTRACT

A plasma processing system is provided that allows for monitoring a plasma processing system during plasma processing. The plasma processing system includes a processing chamber and a monitoring system for monitoring conditions of the processing chamber. By providing tools within a tool housing that is protected from the plasma environment but still in very close proximity thereto, better process monitoring can be achieved.

11 Claims, 7 Drawing Sheets

METHOD AND APPARATUS FOR MONITORING PLASMA CONDITIONS USING A MONITORING RING

CROSS REFERENCE TO RELATED APPLICATIONS

This application claims priority to and is related to U.S. Provisional Application Serial No. 60/454,359, filed on Mar. 14, 2003. The contents of this application is incorporated herein by reference.

FIELD OF THE INVENTION

The present invention relates to plasma processing and more particularly to monitoring the status of a plasma processing chamber using at least one monitoring tool housed within a protective tool housing.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

In order to aid in the manufacture of integrated circuits with uniform characteristics, manufacturers strive to use the most uniform processes possible from run-to-run. Accordingly, manufacturers strive to monitor the processes in the plasma processing chamber and adjust processing parameters if the plasma conditions vary beyond process-specific "normal" ranges.

There is a need for a low cost way to monitor and tune uniformity. Manufacturers of equipment meeting that need have a competitive edge in the market. One highly desirable avenue is improvements in tool performance and process monitoring where the cost of such improvements is small. The company that can enhance tool performance and process monitoring without driving up the tool cost is in a position to increase profit margins. In cyclical industries such as the semiconductor capital equipment industry, increased profit margins, whether in good times or in bad times, can have a dramatic impact on market penetration, especially during downturns.

Many process monitoring tools exist which are individually provided access to within the chamber. However, such individual placement increases the number of access ports that are required to be made into the plasma processing chamber. Each such access port requires a corresponding seal to maintain the vacuum environment, and, therefore, it adds to the complexity of the mechanical and electrical design of the plasma processing chamber. Accordingly, it is disadvantageous to need to maintain a large number of access ports to support an increasing number of tools.

Moreover, a single plasma chamber may be used for plural processes. The tools required to monitor a first process may not be the same as the tools to monitor a second process. Thus, either the plasma chamber has to be designed to have enough access ports to support permanently mounting the tools for both the first and second processes, or the tools must be changed between processes. This disadvantageously either (1) increases the number of access ports in the chamber, or (2) requires that the seals be broken in order to change the tools between processes.

SUMMARY OF THE INVENTION

It is an object of the present invention to provide a tool "channel" that holds process monitoring tools that does not require that the tools be individually mounted through the plasma processing chamber top or wall. Such a channel enables tools to be changed without opening the plasma chamber to atmosphere.

Accordingly, a plasma processing system is provided that allows for monitoring a plasma processing system during plasma processing. The plasma processing system comprises a processing chamber and a monitoring system for monitoring conditions of the processing chamber. By providing tools within a tool housing that is protected from the plasma environment but still in very close proximity thereto, better process monitoring can be achieved.

A method is provided for monitoring a plasma processing system by utilizing at least one tool in a tool housing that is in close proximity to the substrate being processed but without being exposed to the plasma itself. Such tools may include tools monitoring RF or optical transmissions.

BRIEF DESCRIPTION OF THE DRAWINGS

A more complete appreciation of the invention and many of the attendant advantages thereof will become readily apparent to those skilled in the art with reference to the following detailed description particularly when considered in conjunction with the accompanying drawings, in which:

FIG. 2A is a plan view of the electrode assembly showing a single opening for allowing the plasma monitoring tool holder to pass there through;

FIG. 2B is a plan view of the electrode assembly showing a set of openings for allowing a series of plasma monitoring tool holders to pass there through;

DETAILED DESCRIPTION OF THE PREFERRED EMBODIMENTS

Figure 1:
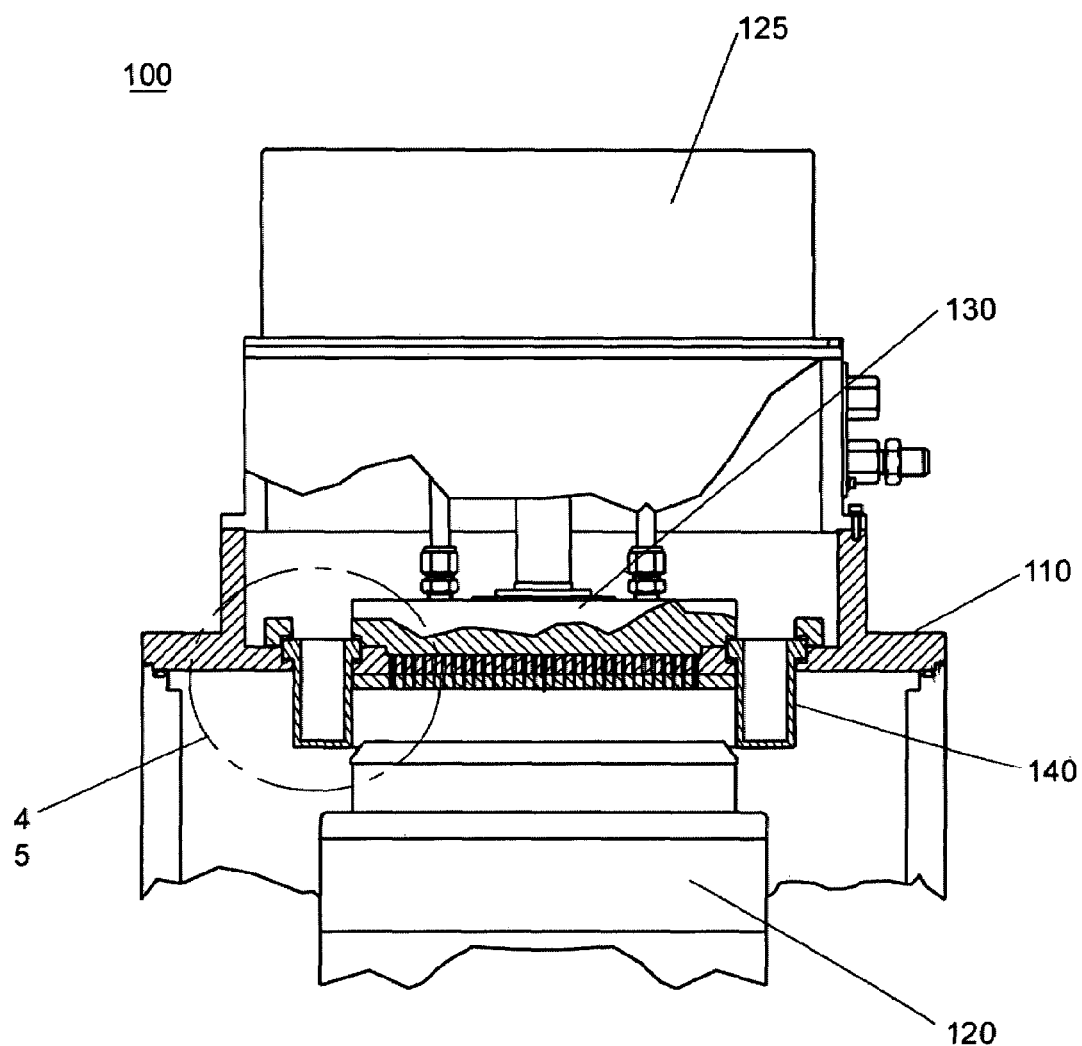
FIG. 1 is a cross-sectional view of a process chamber including a plasma monitoring tool holder (formed using a plasma monitoring insulator in the shape of a channel)
Figure 2A:
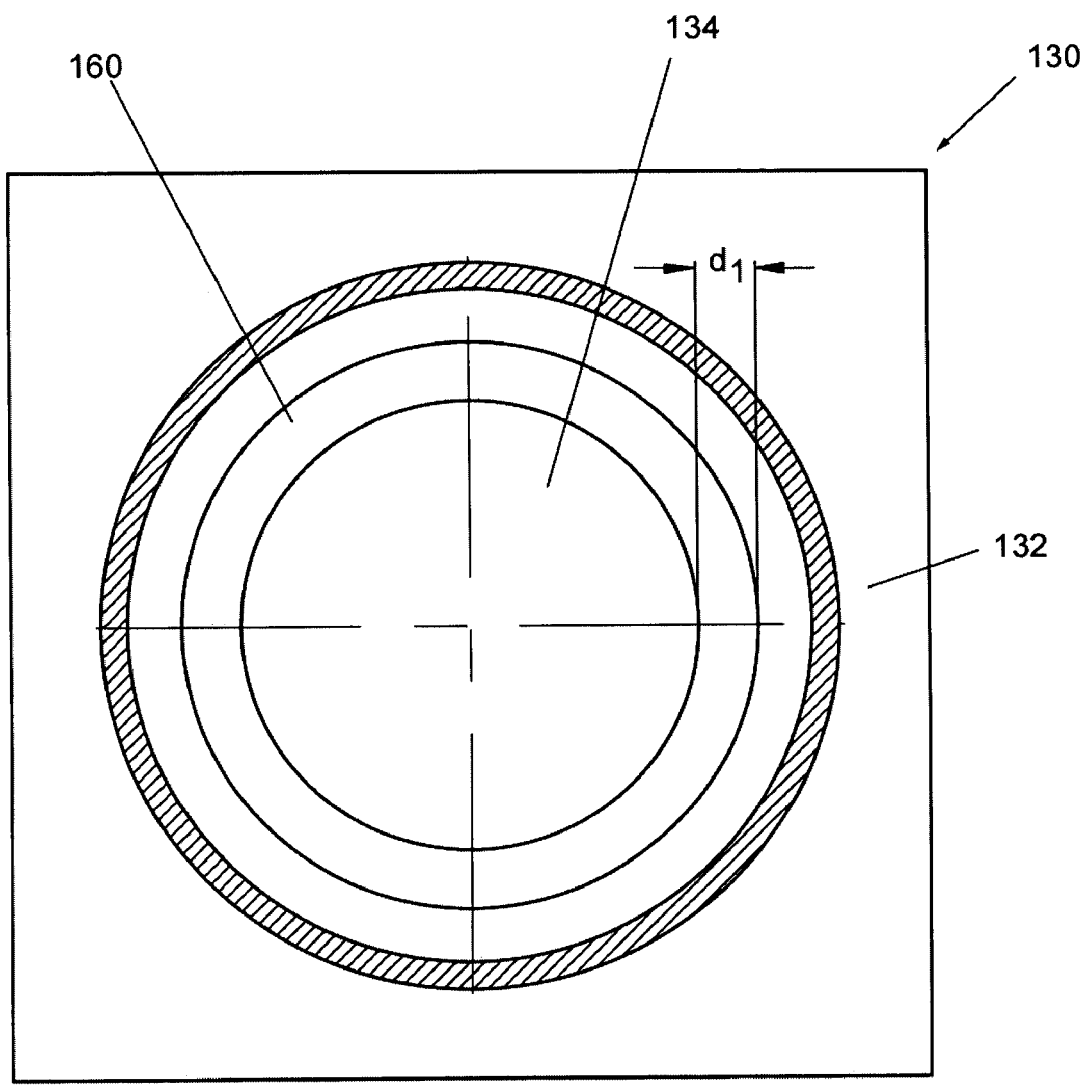

Referring now to the drawings wherein like reference numerals designate identical or corresponding parts throughout the several views, FIG. 1 is a cross-sectional view of a plasma processing system 100 according to the present invention. The system 100 includes a process chamber 110, a chuck assembly 120, a impedance match network 125 and an electrode assembly 130. The system 100 further includes a plasma monitoring tool holder 140 that passes through the electrode assembly 130. As shown in FIG. 2A, the plasma monitoring tool holder 140 passes through a tool holder entry hole 160 in the electrode assembly 130. The tool holder entry hole 160 is depicted as having a width d1 that is present around the whole inner portion of the electrode assembly 130. As shown in FIG. 2A, the electrode assembly 130 comprises an outer electrode assembly 132 and an inner electrode assembly 134 that are coupled to one another via plasma monitoring tool holder 140. For example, the outer electrode assembly 132 is typically maintained at ground electrical potential, and it facilitates coupling of the electrode assembly 130 to the process chamber 110. Additionally, for example, the inner electrode assembly 134 is typically coupled to a RF power generator (not shown) through impedance match network 125, and it facilitates the coupling of RF power to a plasma formed in process chamber 110. Moreover, for example, the plasma monitoring tool holder 140 can be fabricated from an electrically insulating material, and, therefore, it can further serve to electrically insulate the inner electrode assembly 134 from the outer electrode assembly 132.

Figure 2B:
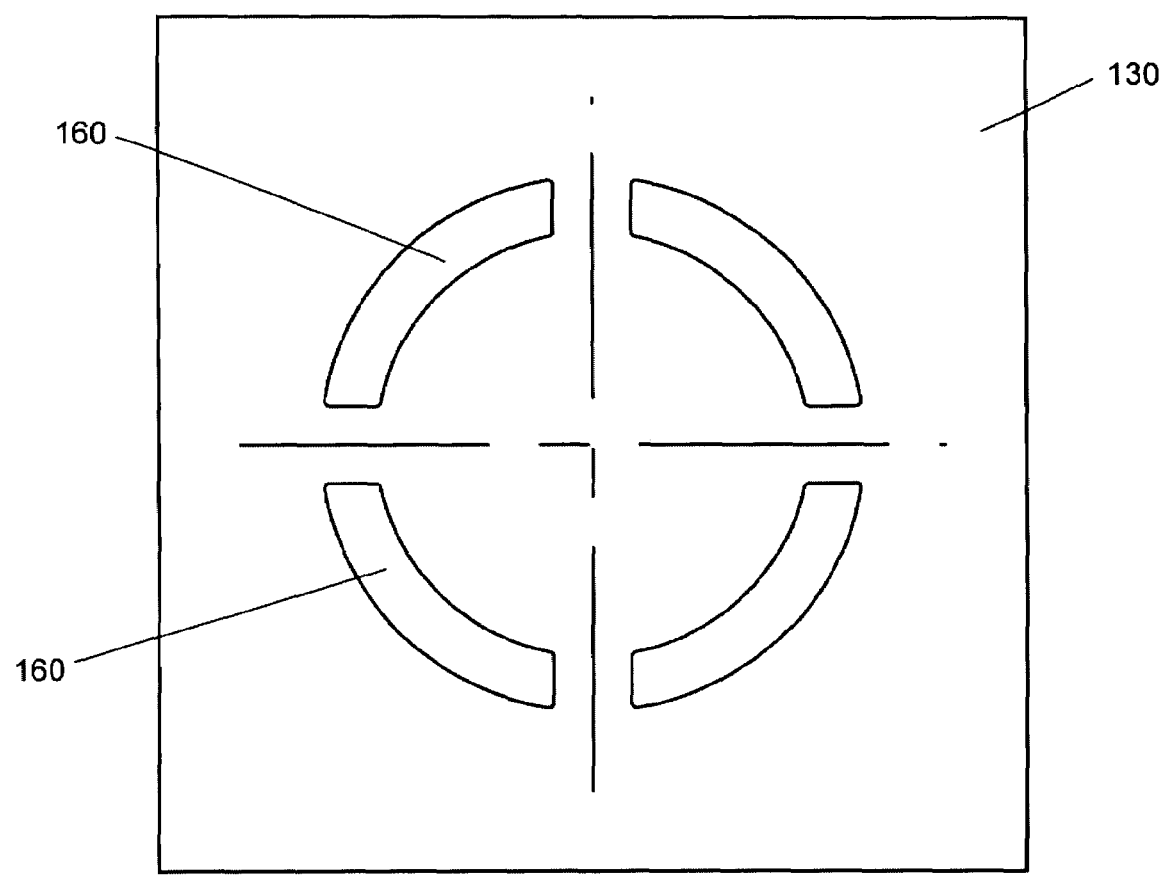

In an alternate embodiment, as shown in FIG. 2B, the tool holder entry hole 160 is divided into sections so that the electrode assembly 130 can be formed from a single piece. Such a configuration also has the advantage that the tool holder 140 is then also designed in sections such that individual tools can be placed in each of the individual sections. Such sections enable the plasma to be monitored spatially to look for plasma non-uniformities. Such non-uniformities can be detrimental to performance of the integrated circuits constructed in the plasma processing system.

Figure 3A:
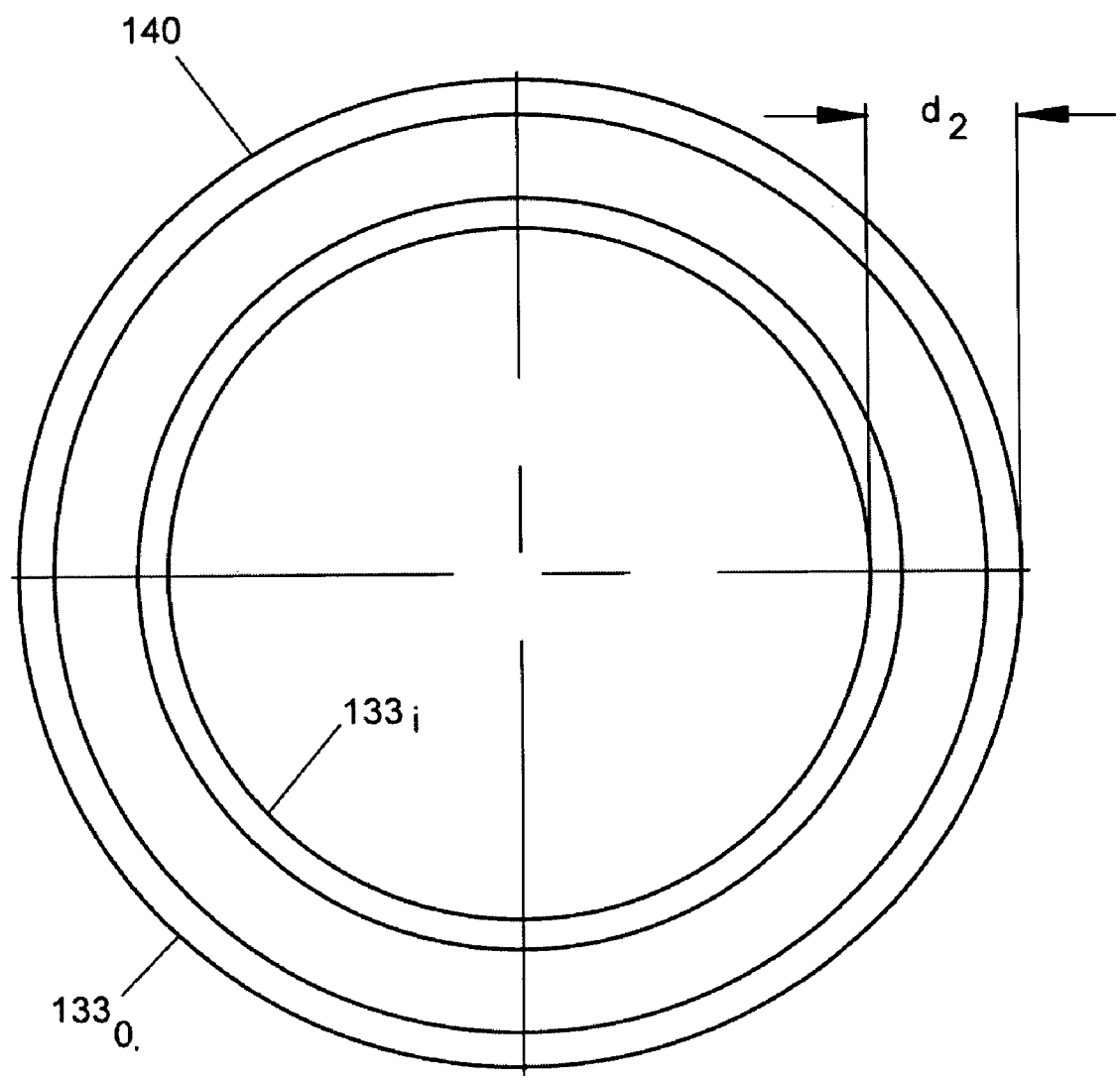
FIG. 3A is a plan view of a plasma monitoring tool holder for use in the opening of FIG. 2A.

As shown in FIG. 3A, a tool holder 140 has substantially the same shape as the tool holder entry hole 160. However, the tool holder 140 includes inner and outer edges 133i and 133o that extend a width d2 that is larger than the width d1 of the hole 160. Because of this additional width, the edges 133i and 133o prevent the tool holder 140 from falling into the process chamber 110.

Figure 3B:
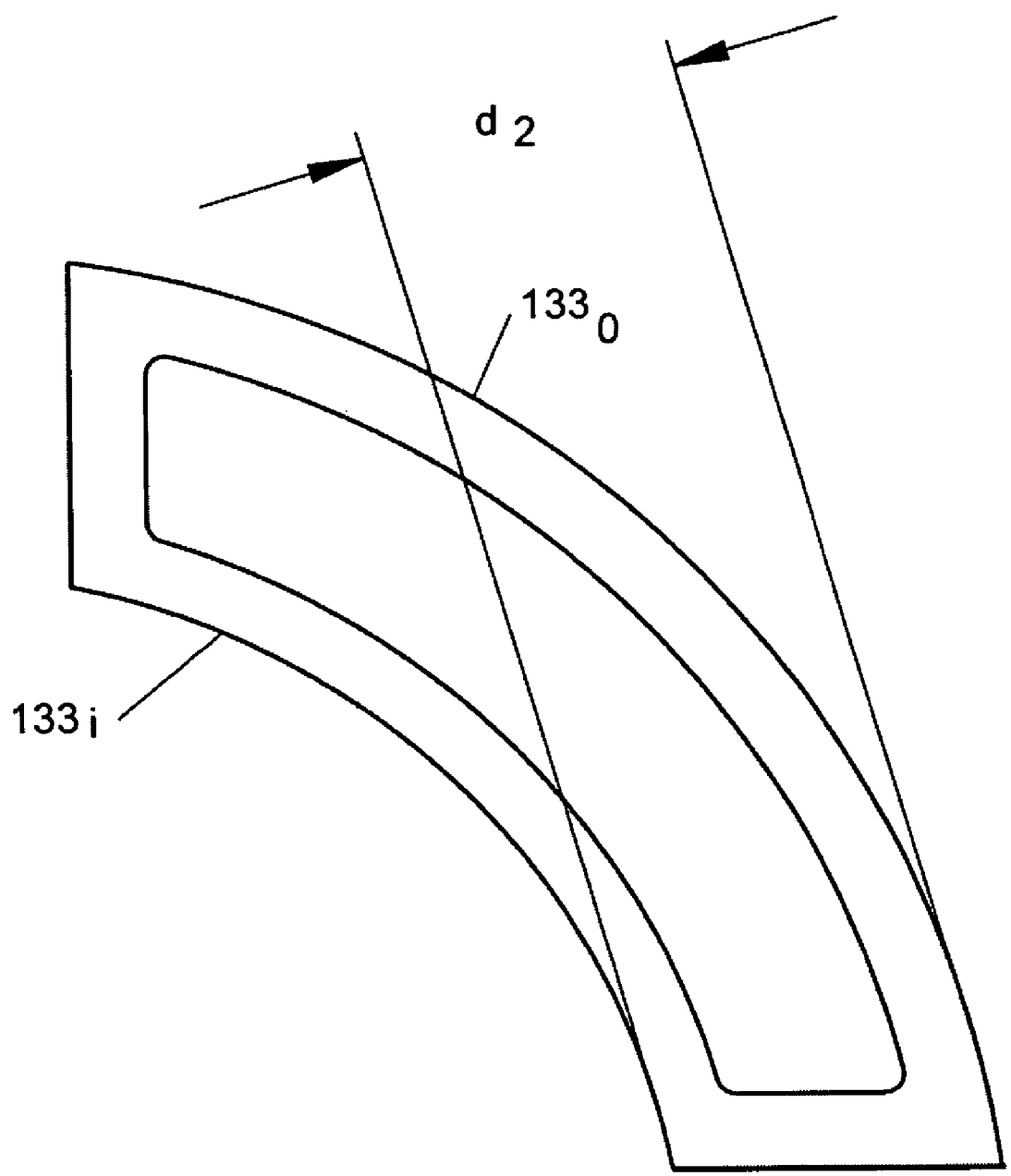
FIG. 3B is a plan view of a plasma monitoring tool holder for use in the openings of FIG. 2B.

As shown in FIG. 3B, the tool holder 140 can alternatively be divided into separate smaller sections such that individual sections are placed into corresponding holes (e.g., as shown in FIG. 2B).

Figure 4:
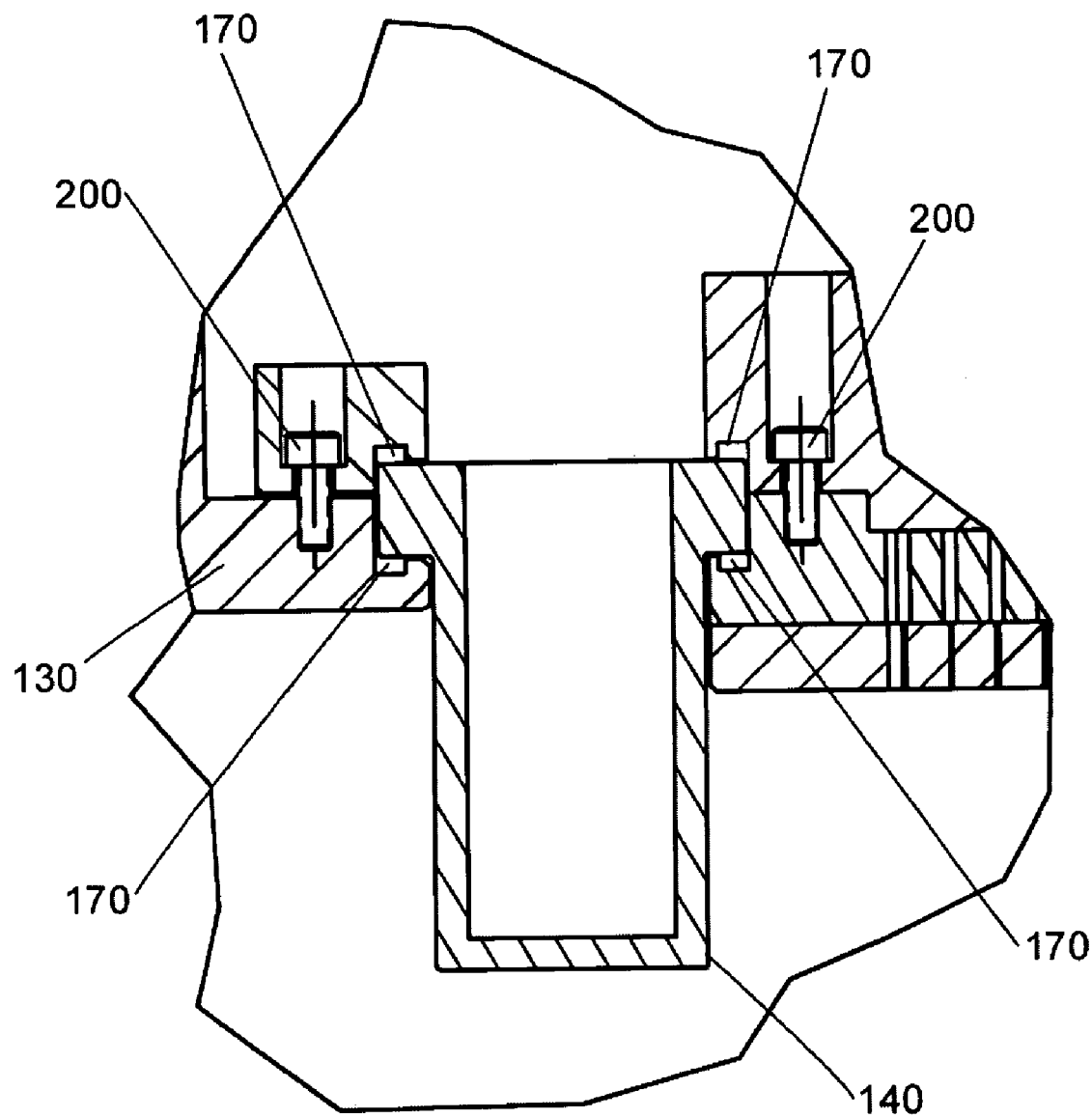
FIG. 4 is a cross-sectional view of the plasma monitoring tool holder mounted on top of the electrode assembly (with an optional seal therebetween)

As shown in FIG. 4, when the tool holder 140 is inserted into the tool holder entry hole 160 from above, the resulting structure creates a stack of components. As illustrated, the stack may optionally include a seal, gasket or o-ring 170 for preventing leaks between the tool holder 140 and the tool holder entry hole 160. The stack may be maintained together through a pressure applying device (e.g., a screw or bolt 200, and tapped hole).

Figure 5:
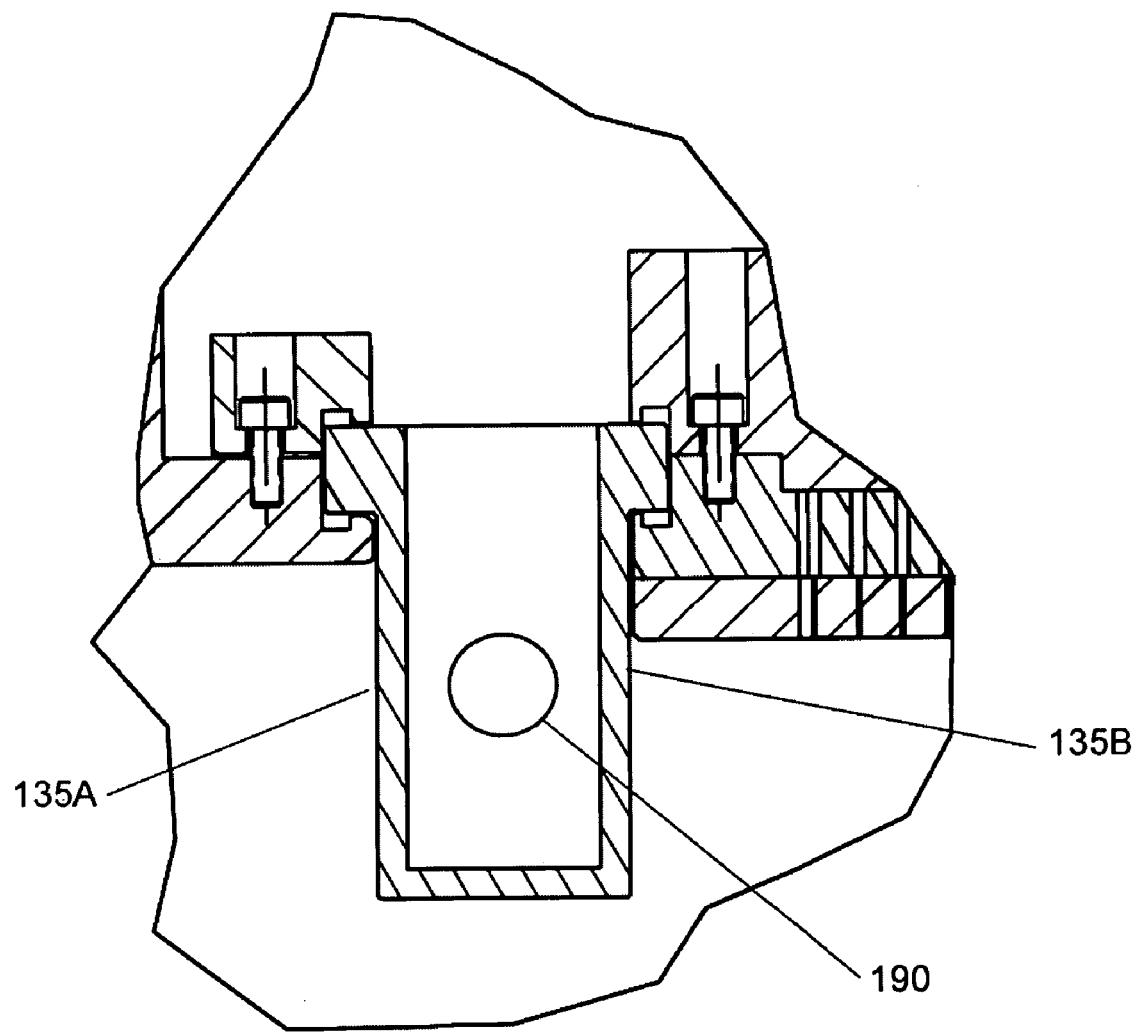
FIG. 5 is a partial horizontal cross-section of a tool in a channel of a plasma monitoring tool holder.

Once the tool holder has been placed into the tool holder entry hole, individual tools may be placed into the channel of the tool holder. FIG. 5 illustrates a horizontal cross section of the tool holder 140 having sidewalls 135A and 135B. The process monitoring tool 190 is then placed in the channel formed between the sidewalls 135A and 135B. Moreover, the tool 190 is positioned such that it is maintained close to the plasma processing area just above the substrate holder or chuck assembly 120.

The tool 190 may be any process monitoring device that receives electrical or optical emissions from the plasma in the plasma chamber 110. Such tools include, but are not limited to, current, voltage and temperature probes. Such tools may utilize antennas to receive a desired portion of the RF energy transmitted from the process chamber 110. Additionally, optical sensors can be used to determine emitted wavelengths of light and their intensities if the tool holder 140 is made from an optically transmissive material.

The tool holder 140 is preferably made of a material that is resistant to the plasma processing environment inside the process chamber 110. Quartz is an exemplary material that is optically transmissive, and radio wave transmissive. Quartz also allows a sufficient amount of heat to be passed such that a temperature of the plasma may also be measured.

The exposed surface of the tool holder 140 may also be coated with a protective barrier to extend the time that the tool holder may be exposed to a plasma before needing to be refurbished or replaced.

Accordingly, a method of measuring, according to the present invention, includes: providing a tool holder passing through an electrode assembly within a plasma chamber; and providing tools within the tool holder that are not exposed to the plasma but which measure environmental factors about the plasma in the plasma chamber. These tools may be optical, electrical or mechanical based, such as a fiber optically coupled optical emission spectroscopic device, a radio frequency (RF) current probe, a RF emission probe, etc.

The method further comprises changing a tool (which has been passed through the electrode assembly) that is used to measure a processing parameter without exposing the plasma chamber to the atmosphere.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A plasma monitoring tool holder for passing through an electrode assembly of a plasma processing system, the tool holder comprising:

a channel portion that extends into said plasma processing system for passing through at least one hole in the electrode assembly, the channel portion having an open end and a closed end, the closed end and side surfaces of the channel portion having exposed surfaces for coming into contact with a plasma; wherein the open end of the channel portion is in the plan view a single ring or a plurality of ring segments disposed centrally to the electrode assembly; and a support section at the open end for holding the tool holder to the electrode assembly, wherein the channel portion is configured to allow a tool to enter the open end.

2. The tool holder according to claim 1, wherein the support section comprises at least one edge, wherein a width of the channel portion plus the at least one edge is larger than a width of the hole in the electrode assembly.

3. The tool holder according to claim 1, wherein the channel portion comprises quartz.

4. The tool holder according to claim 1, wherein the channel portion comprises a protective barrier on the exposed surface.

5. A plasma processing system comprising:
a plasma chamber;
an electrode assembly for applying power to the process chamber; and
a monitoring tool holder for passing through the electrode assembly, the tool holder comprising:

a channel portion that extends into said plasma chamber for passing through at least one hole in the electrode assembly, the channel portion having an open end and a closed end, the closed end and side surfaces of the channel portion having exposed surfaces for coming into contact with a plasma, wherein the open end of the channel portion is in the plan view a single ring or a plurality of ring segments disposed centrally to the electrode assembly; and a support section at the open end for holding the tool holder to the electrode assembly, wherein the channel portion is configured to allow a tool to enter the open end.

6. The system according to claim 5, further comprising at least one tool contained within the tool holder for measuring at least one processing parameter of the plasma of the plasma chamber.

7. The system according to claim 6, wherein the at least one tool comprises at least one of a current and a voltage probe.

8. The system according to claim 6, wherein the at least one tool comprises a temperature probe.

9. The system according to claim 6, wherein the at least one tool comprises an optical sensor.

10. The system according to claim 5, further comprising at least one of a seal, a gasket and an o-ring between the support section and the electrode assembly.

11. The system according to claim 10, further comprising at least one fastener for coupling the tool holder to the electrode assembly.

* * * * *